United States Patent [19]

Yang

[11] Patent Number: 5,486,482
[45] Date of Patent: Jan. 23, 1996

[54] PROCESS FOR FABRICATING METAL-GATE CMOS TRANSISTOR

[75] Inventor: Sheng-Hsing Yang, Hsinchu, Taiwan

[73] Assignee: United Microelectronics Corporation, Hsinchu, Taiwan

[21] Appl. No.: 437,724

[22] Filed: May 9, 1995

[51] Int. Cl.⁶ .................. H01L 21/8238; H01L 21/8234
[52] U.S. Cl. ................... 437/34; 437/41; 437/57
[58] Field of Search ................. 437/34, 56, 57, 437/58, 40 R, 41 R, 913, 40 RG, 41 RCM, 41 RLD

[56] References Cited

U.S. PATENT DOCUMENTS

| | | | |
|---|---|---|---|
| 5,376,568 | 12/1994 | Yang | 437/34 |
| 5,382,820 | 1/1995 | Yang et al. | 437/913 |
| 5,424,233 | 6/1995 | Yang et al. | 437/203 |

*Primary Examiner*—Tom Thomas
*Assistant Examiner*—Michael Trinh
*Attorney, Agent, or Firm*—Townsend and Townsend and Crew

[57] ABSTRACT

A process for fabricating metal-gate CMOS transistors on a semiconductor substrate having a well region therein is disclosed herein. The process comprises the steps of: First forming a shielding layer with designated patterns on the substrate and the well region, and, then, forming first field oxides on the substrate or the well region between the designated patterns of the shielding layer through a thermal oxidation procedure. After that, the first field oxides are removed to expose recesses, and drift regions are formed in the substrate and the well region beneath the recesses. Next, second field oxides are formed above the recesses and the shielding layer are subsequently removed. Then, heavily-doped regions are formed in the substrate and the well region between the drift regions, and lightly-doped regions are formed beneath the heavily-doped region, both of which serve as source/drain regions. Finally, a gate oxide layer is formed on the substrate and the well region between the source/drain regions, and an isolation oxide layer is formed on the heavily-doped regions simultaneously, thereby forming a metal gate on the gate oxide layer.

10 Claims, 5 Drawing Sheets

PROCESS FOR FABRICATING METAL-GATE CMOS TRANSISTOR

BACKGROUND OF THE INVENTION

Field of the Invention

The present invention relates in general to a process for fabricating a metal-gate CMOS transistor. In particular, the present invention relates to a process for fabricating a high-voltage metal-gate CMOS transistor. More particularly, the present invention relates to a process for fabricating a high-voltage metal-gate CMOS transistor that features self-alignment.

Technical Background

Conventional methods for fabricating high voltage metal-gate CMOS transistors employ a photolithography technique define the various configurational regions of the transistor. The use of photolithography procedures involves the precise alignment of the photomasks used. The precision of the alignment is even more difficult when more than one photolithography procedure is required for the fabrication process. The direct result of mis-aligned photomasks is the drift of the electronic characteristics of the transistor devices fabricated. Transistors coming out of different fabrication batches are typified by varied electronic characteristics, since the alignment conditions in each batch process of fabrication are slightly different.

Summary of the Invention

It is therefore an object of the present invention to provide a process for fabricating a high voltage metal-gate CMOS transistor characterized by self-alignment in the process step of its fabrication.

It is another object of the present invention to provide a process for fabricating a high voltage metal-gate CMOS transistor having the capability of sustaining high gate voltage.

It is still another object of the present invention to provide a process for fabricating a high-voltage metal-gate CMOS transistor having simplified fabrication process steps.

The present invention achieves the above-identified objects by providing a process for fabricating metal-gate CMOS transistors on a semiconductor substrate. The CMOS transistor comprises a pair of N- and PMOS transistors. The process comprises the steps of: Forming a shielding layer with designated patterns on the substrate, and the well region in the substrate, the shielding layer defines the drift regions for the N- and PMOS transistors between the shielding patterns; performing a process of oxidation utilizing the shielding layer as the shielding mask for forming first field oxide layers over the surface of both the well-region and the substrate; performing consecutive processes of ion implantation utilizing the shielding layer as the shielding mask for implanting N- and P-type impurities into both the well-region and the substrate respectively, thereby forming the drift regions of the N- and PMOS transistors; performing a process of oxidation utilizing the shielding layer as the shielding mask for forming second field oxide layers over the drift regions; removing the shielding layer; performing consecutive processes of ion implantation utilizing the second field oxide layers as shielding mask for implanting N- and P-type impurities into both the well-region and the substrate between the drift regions respectively, thereby forming heavily-doped regions, and lightly-doped regions beneath the heavily-doped regions for forming the drain and source regions of the N- and PMOS transistors; performing a process of oxidation for forming gate oxide layers between the source and drain regions of both the N- and PMOS transistors, with the thickness of the gate oxide layer over the heavily-doped regions forming the isolation oxide layer being greater than that of the gate oxide layer; and, performing a process of metalization for forming metal gates over the gate oxide layer and for forming metal contacts over the source and drain regions for both the N- and PMOS transistors respectively.

BRIEF DESCRIPTION OF THE DRAWING

Other objects, features, and advantages of the present invention will become apparent by way of the following detailed description of the preferred but non-limiting embodiments. The description is made with reference to the accompanied drawings in which.

DETAILED DESCRIPTION OF THE PREFERRED EMBODIMENT

Figure 1A:
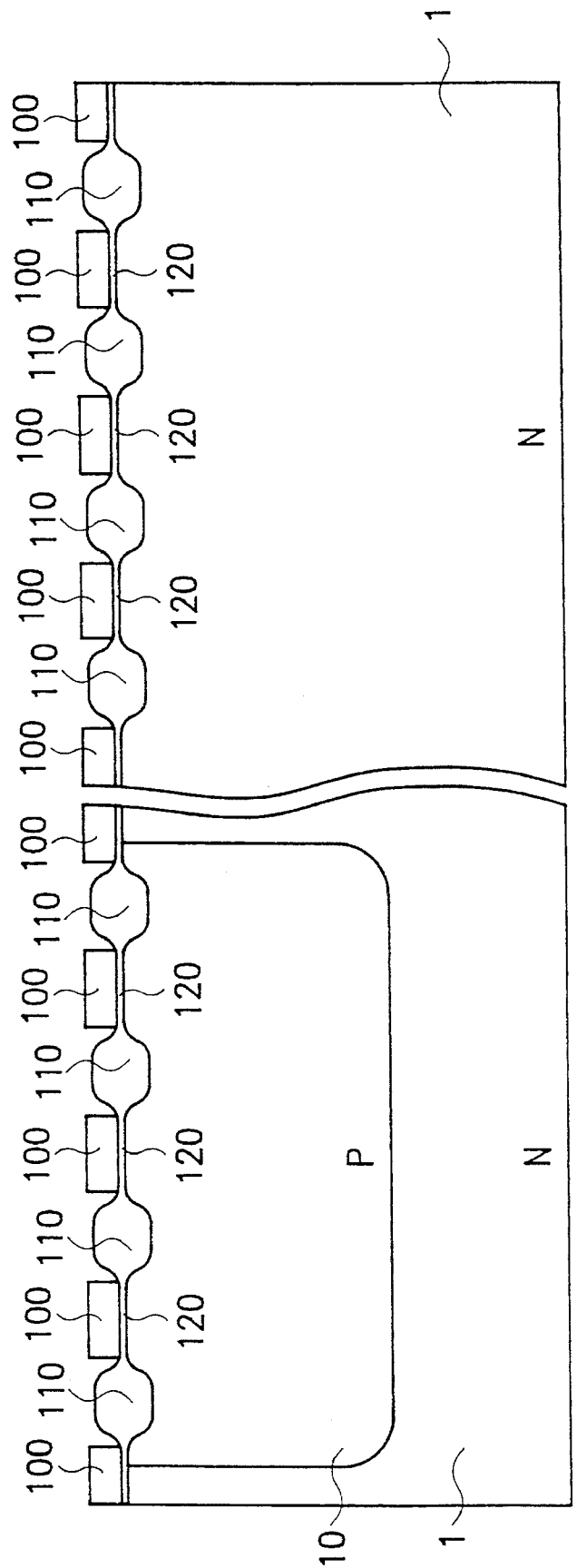
FIGS. 1A–1E schematically show the cross-sectional views of a CMOS transistor architecture as depicted from the selected stages of the process of fabrication in accordance with a preferred embodiment of the present invention, wherein the left-hand side shows an NMOS transistor and the right-hand side shows a PMOS transistor.

During the process of the following description of the process of fabricating high-voltage metal-gate CMOS transistor of the present invention, reference should be made to the right and left hand sides of FIGS. 1A–1E, simultaneously. The left-hand sides of FIGS. 1A–1E are the cross-sectional view of the NMOS transistor for the CMOS transistor pair, while the right-hand sides of FIGS. 1A–1E are the cross-sectional view of the PMOS transistor for the CMOS transistor pair, as depicted from the selected stages of the fabrication process of the present invention. Basically, the equivalent stage of the process steps for both the NMOS and PMOS are described in the corresponding FIGS. of the drawing.

The disclosed process of fabrication is suitable for fabricating a metal-gate CMOS transistor on a substrate of the first conductivity type having formed thereon a well region of a second conductivity type. For example, in the exemplified embodiment of the present invention, an N-type substrate 1 having a P-well region 10 formed thereon is utilized for the fabrication of the high-voltage metal-gate CMOS transistor, although a P-type substrate with an N-well region is equally applicable for the fabrication of the N- and PMOS transistor pair of the CMOS transistor. A detailed description of the process for fabrication of the high-voltage metal-gate CMOS transistor follows.

Stage 1

Refer to FIG. 1A for the fabrication of the MOS transistors of the first and second conductivity types for the high-voltage metal-gate CMOS transistor of the present invention. As is seen in the drawings, a shielding layer 100 is formed, with its designated pattern, on the surface of the substrate 1 of the first conductivity type. In the case of the transistor of the first conductivity type in the left-hand side of FIG. 1A, a well region 10 of the second conductivity type is further formed in the substrate 1. Shielding layer 100 is then utilized as the shielding mask for the implementation of an oxidation procedure that forms the first field oxide layer 110 on the surface of the well region 10 and the surface of the substrate 1. After its formation, the first field oxide layer 110 may then be removed.

The above-described procedures can be achieved by, for example, first forming a pad oxide layer 120 on the surface of the P-well region 10, as well as on the N-type substrate 1. A shielding layer 100 of, for example, silicon nitrides, may then be deposited on the pad oxide layer 120, and after the implementation of a conventional photolithography procedure applied on the shielding layer 100, the patterns shown in FIG. 1A are obtained. The following thermal oxidation procedure then forms the first field oxide layers 110 as shown in FIG. 1A. After the formation, the first field oxide layer 110 may be removed.

Stage 2

Figure 1B:
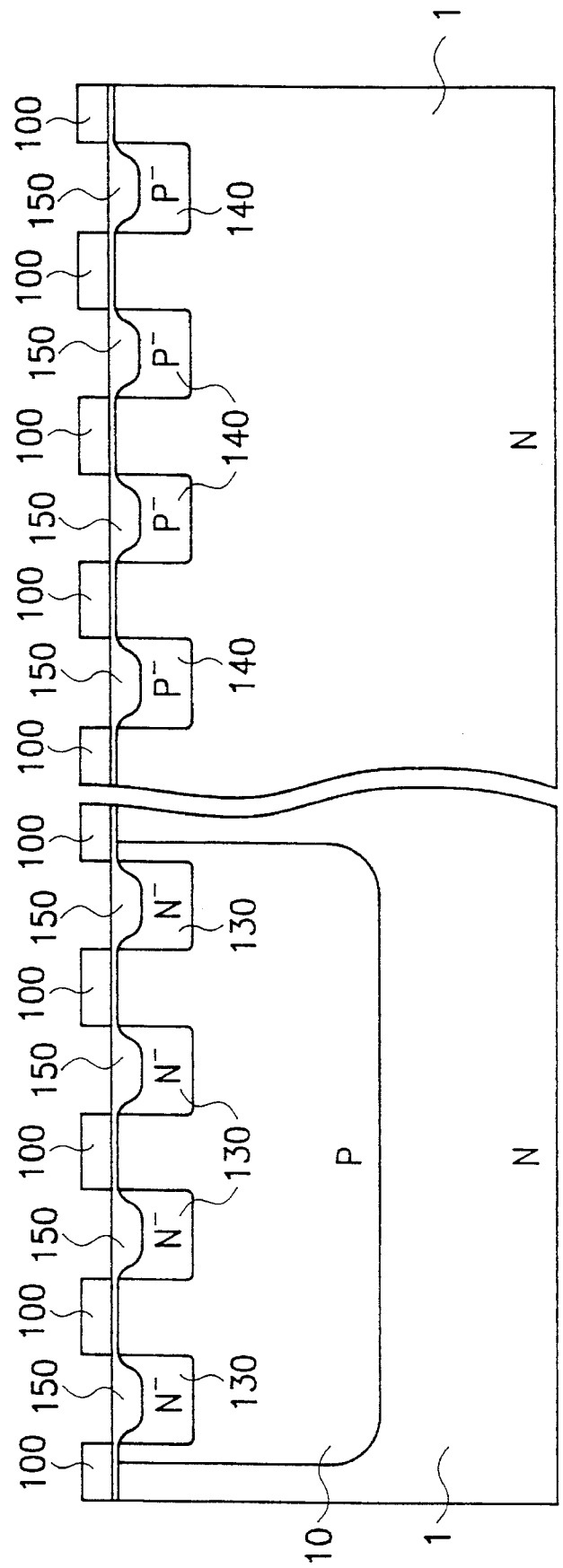

Then, referring to FIG. 1B, the shielding layer 100 is employed as the shielding mask for the implementation of an impurity implantation and then a thermal oxidation procedure that first form the drift regions 130 and 140 and then the second field oxide layers 150 above the drift regions 130 and 140, as shown in FIG. 1B, respectively.

The above procedure can be achieved by, for example, in the case of the NMOS transistor of the exemplified embodiment, applying a photolithography procedure to form the photoresist layer covering the designated portions of the N-type substrate 1 for the implantation of the N-type impurities into the P-well region 10, thereby forming the $N^-$ drift regions 130 for the NMOS transistor 12 to be fabricated. Then, for the PMOS transistor of the CMOS transistor device, the photoresist layer be utilized to cover the designated portions of the P-type well region 10 for the implantation of the P-type impurities into the substrate 1, thereby forming the $P^-$ drift regions 140 for the PMOS transistor 14 to be fabricated. Then, a thermal oxidation procedure can be performed to form the field oxide regions 150 above the drift regions 130 and 140. Afterwards, the shielding layer 100 may then be removed.

Stage 3

Figure 1C:
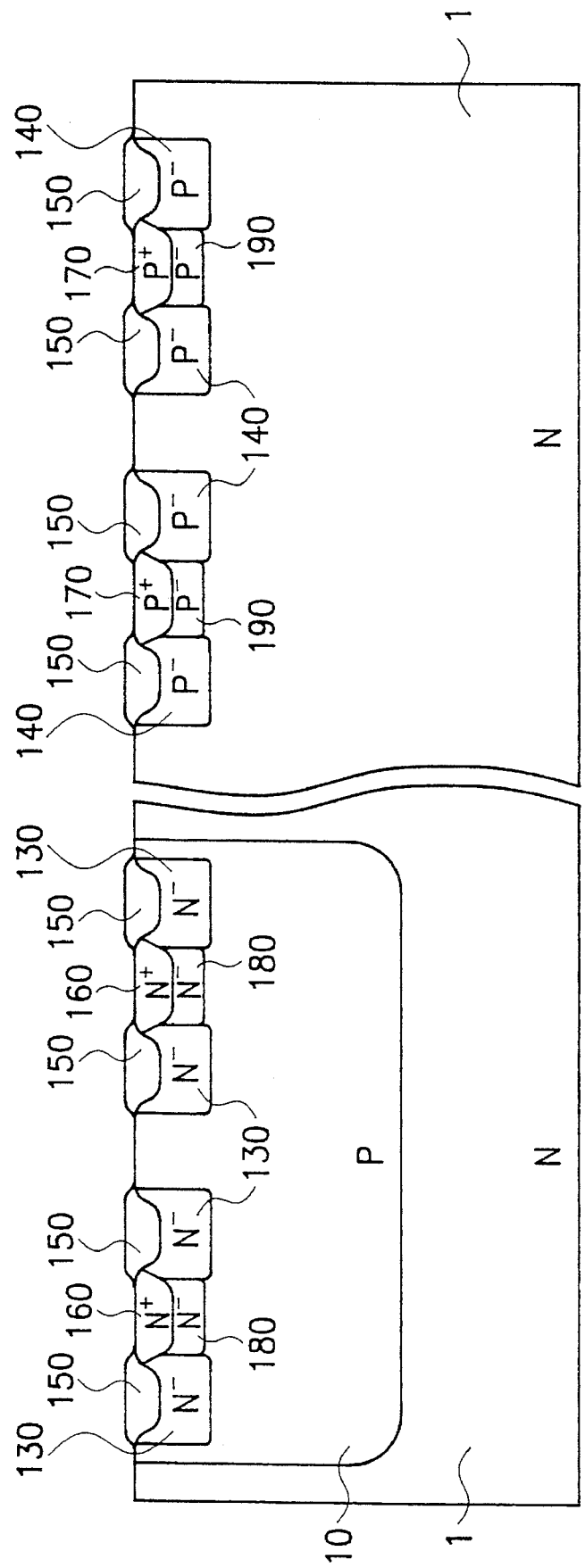

Refer next to FIG. 1C. The second field oxide layers 150 are then utilized as the shielding mask for the implementation of two ion implantation procedures that implant impurities of the first and second conductivity types into the designated regions of the surface of the well-region 10 of the second conductivity type and the designated regions of the surface of the substrate 1 of the first conductivity type, respectively. This forms the heavily-doped regions 160 and lightly-doped regions 180 for the MOS transistor of the first conductivity type, and the heavily-doped regions 170 and lightly-doped regions 190 for the MOS transistor of the second conductivity type respectively.

The above procedure can be achieved by, for example, first applying a suitable photoresist layer that exposes only the regions between the $N^-$ drift regions 130 for the NMOS transistor 12 to be fabricated. This allows for the application of two subsequent impurity implantation procedures but with different energy levels and dosage that subsequently implant N-type impurities to form the lightly-doped $N^-$ regions 180 and the heavily-doped $N^+$ regions 160 in the P-well region 10. Based on a similar arrangement, for the case of the PMOS transistor 14 to be fabricated, the application of another two subsequent impurity implantation procedures with different energy levels and dosage would subsequently implant P-type impurities to form the lightly-doped $P^-$ regions 190 and the heavily-doped $P^+$ regions 170 in the N-type substrate 1.

Stage 4

Figure 1D:
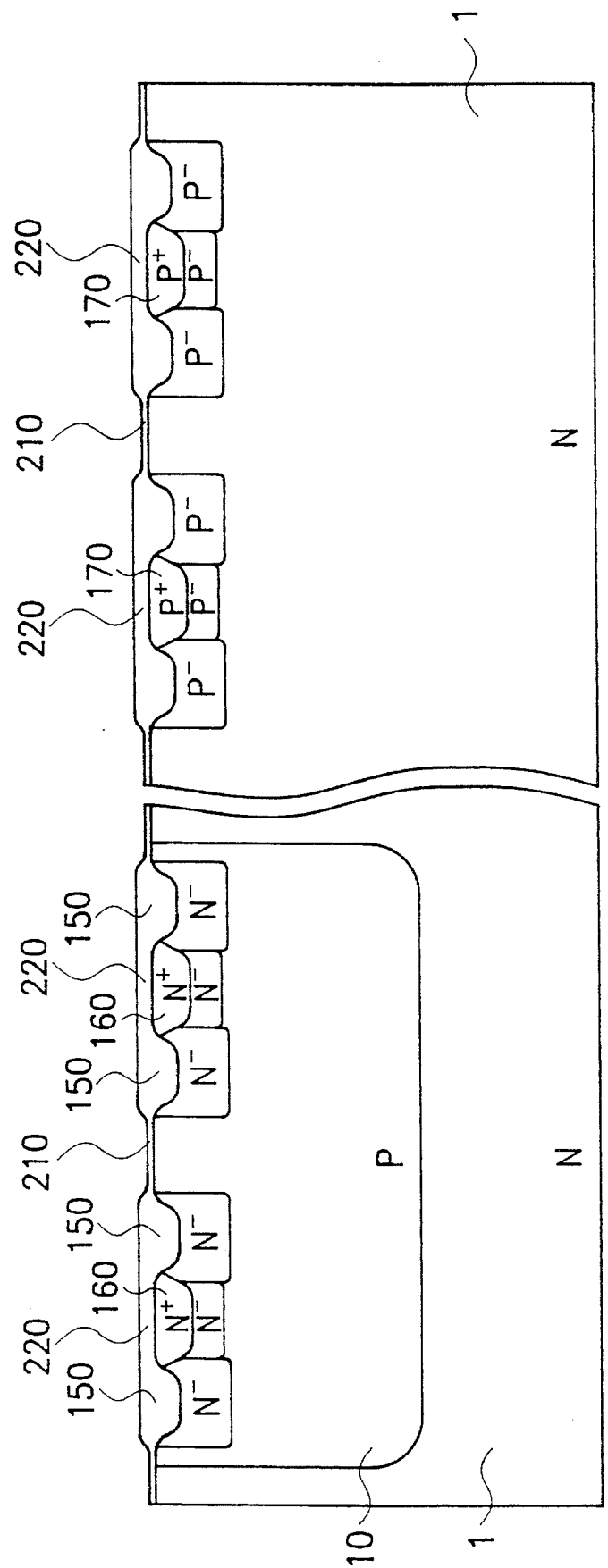

Now referring to FIG. 1D, a thermal oxidation procedure is then performed to form gate oxide layers 210 that cover the regions between the drain and source regions of both the fabricated MOS transistors of the first and second conductivity types.

While forming the gate oxide layers 210, the isolation oxide layer 220 simutaneously formed will have a greater thickness above the heavily-doped $N^+$ regions 160 and $P^+$ regions 170 respectively, than at the gate regions 210. This is the result of the inherently higher concentrations of the impurity implantation in the regions 160 and 170 respectively.

Stage 5

Figure 1E:
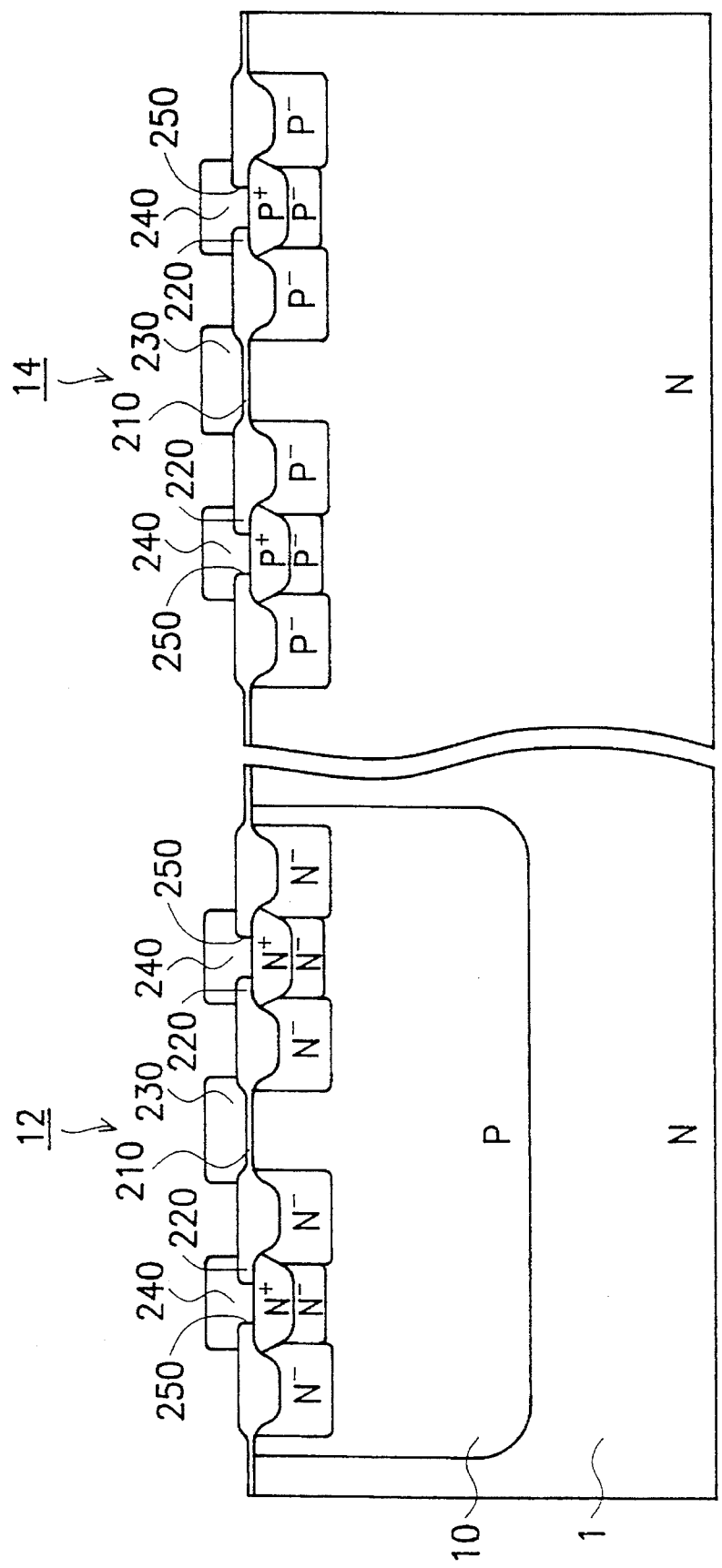

Finally, referring to FIG. 1E, a process of metalization is performed to form the metal gates 230 over the gate oxide layer 210 and the metal contacts 240 for the drain and source regions of both the MOS transistors of the first and second conductivity types.

This can be done by, for example, first preparing a contact window 250 for both the NMOS and PMOS transistors in their respective isolation oxide layers 220. Metalization procedures such as, for example, metal sputtering, may be implemented to form a metal layer, which is then subjected to a process of controlled etching to shape the metal gates 230 and the metal contacts 240 as schematically shown in the drawing. This generally concludes the process of fabricating the high-voltage metal-gate CMOS transistor, which comprises the pair of NMOS and PMOS transistors generally identified by the reference numerals 12 and 14 in FIG. 1E, respectively.

Due to the fact that the process of fabrication of the present invention relies on the shielding layer for the formation of the drift regions and the second field region oxide layers formed in the drift regions, and since the second field region oxide layers are further utilized as the shielding mask for the formation of the source and drain regions of both the NMOS and PMOS transistors that in combination comprise the CMOS transistor, the alignment condition in the shaped regions of the transistor is much better than can be achieved by the conventional processes of fabrication that rely on the use of multiple photolithography procedures.

On the other hand, since the second field oxide layers are formed over the lightly-doped drift regions, and also because of the fact that the gate oxide layers may be formed simultaneously with the formation of the isolation oxide layers that are relatively greater in thickness, the isolation is improved, with the additional benefit that the number of fabrication process steps for the CMOS transistor device is reduced.

Thus, the present invention being described based on the exemplified embodiments but, as persons skilled in the art can appreciate, these embodiments may be modified without departing from the scope of the present invention.

I claim:

1. A process for fabricating a metal-gate MOS transistor for use in CMOS integrated circuits formed on a semiconducting substrate of a first conductivity type having a well region of a second conductivity type therein, comprising:

(a) forming a shielding layer with designated patterns on said well region;

(b) forming first field oxides on said well region between said designated patterns through a thermal oxidation procedure;

(c) removing said first field oxides exposing recesses;

(d) forming drift regions of said first conductivity type in said well region beneath said recesses;

(e) forming second field oxides above said drift regions;

(f) removing said shielding layer;

(g) forming heavily-doped regions of said first conductivity type in said well region between each pair of said drift regions and lightly-doped regions of said first conductivity type beneath said heavily-doped region as source/drain regions;

(h) forming a gate oxide layer on said well region between said source/drain regions and an isolation oxide layer on said heavily-doped regions; and (i) forming a metal gate on said gate oxide layer.

2. The process as in claim 1, wherein step (i) further comprises:

etching and patterning said isolation oxide layer forming contact windows to expose said heavily-doped regions; and forming metal contacts on said heavily-doped regions via said contact windows.

3. The process as in claim 1, wherein said shielding layer is silicon nitride.

4. The process as in claim 1, wherein said first conductivity type is N-type and said second conductivity type is P-type.

5. The process as in claim 1, wherein said first conductivity type is P-type and said second conductivity type is N-type.

6. A process for fabricating a metal-gate MOS transistor for use in CMOS integrated circuits formed on a semiconducting substrate of a first conductivity type, comprising:

(a) forming a shielding layer with designated patterns on said substrate;

(b) forming first field oxides on said substrate between said designated patterns through a thermal oxidation procedure;

(c) removing said first field oxides exposing recesses;

(d) forming drift regions of a second conductivity type in said substrate beneath said recesses;

(e) forming second field oxides above said drift regions;

(f) removing said shielding layer;

(g) forming heavily-doped regions of said second conductivity type in said substrate between each pair of said drift regions and lightly-doped regions of said second conductivity type beneath said heavily-doped region as source/drain regions;

(h) forming a gate oxide layer on said sustrate between said source/drain regions and an isolation oxide layer on said heavily-doped regions; and (i) forming a metal gate on said gate oxide layer.

7. The process as in claim 6, wherein step (i) further comprises:

etching and patterning said isolation oxide layer forming contact windows to expose said heavily-doped regions; and forming metal contacts on said heavily-doped regions via said contact windows.

8. The process as in claim 6, wherein said shielding layer is silicon nitride.

9. The process as in claim 6, wherein said first conductivity type is N-type and said second conductivity type is P-type.

10. The process as in claim 6, wherein said first conductivity type is P-type and said second conductivity type is N-type.

* * * * *